United States Patent
Dabral et al.

(10) Patent No.: US 7,126,986 B2
(45) Date of Patent: Oct. 24, 2006

(54) METHOD AND SYSTEM FOR IMPROVED PHASE TRACKING

(75) Inventors: Sanjay Dabral, Palo Alto, CA (US); Chamath Abhayagunawardhana, Portland, OR (US); Ken Drottar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 798 days.

(21) Appl. No.: 10/262,359

(22) Filed: Sep. 30, 2002

(65) Prior Publication Data

US 2004/0062332 A1    Apr. 1, 2004

(51) Int. Cl.
*H04B 17/00* (2006.01)
*H04L 25/00* (2006.01)

(52) U.S. Cl. ............................. 375/226; 375/371
(58) Field of Classification Search .............. 375/219, 375/220, 222, 224, 226, 285, 355, 371–376
See application file for complete search history.

(56) References Cited

U.S. PATENT DOCUMENTS

| | | | |
|---|---|---|---|
| 5,428,649 A * | 6/1995 | Cecchi | 375/372 |
| 5,485,490 A | 1/1996 | Leung et al. | |
| 5,692,022 A * | 11/1997 | Haulin et al. | 375/357 |
| 6,956,921 B1 * | 10/2005 | Hansson | 375/373 |

* cited by examiner

*Primary Examiner*—Don N. Vo
(74) *Attorney, Agent, or Firm*—Blakely, Sokoloff, Taylor & Zafman LLP (57) ABSTRACT

A method and system for improved phase tracking in communication systems is disclosed. In one embodiment, a method, comprises identifying a slow-time varying phase drift on a link by counting long term beats; calibrating an interpolator with the phase drift; predicting a future phase drift; and updating the interpolator periodically with the future phase drift prediction.

10 Claims, 7 Drawing Sheets

METHOD AND SYSTEM FOR IMPROVED PHASE TRACKING

FIELD OF THE INVENTION

This invention relates to computer software and hardware, and more specifically to a method and system for improved phase tracking in plesiochronous links.

BACKGROUND OF THE INVENTION

As electronic and computer technology continues to evolve, communication of information among different devices, either situated near by or at a distance becomes increasingly important. For example, it is now more desirable than ever to provide for high-speed communications among different chips on a circuit board, different circuit boards in a system, and different systems with each other. It is also increasingly desirable to provide such communications at very high speeds, especially in view of the large amount of data required for data communications in intensive data consuming systems using graphical or video information, multiple input-output channels, local area networks, and the like.

It is particularly desirable to enable individual personal computers, workstations, or other computing devices, within which data is normally internally transferred using parallel data buses, to communicate with each other over relatively simpler point-to-point links. Such links typically have high bandwidth, thereby reducing the 64-bit or wider data paths within computing systems now commonly available. relatively simple transmission lines. Such transmission lines typically include only one or two conductors, in contrast with the 64-bit and wider data paths within computing systems now commonly available.

Systems may need to communicate. These systems may have different clock sources (e.g. clock crystals) that are nominally at the same frequency, but due to manufacturing tolerances, are really within a specified frequency tolerance. This difference in frequency makes the transmitter and receiver drift with time, and therefore some method to track this drift is required at the receiver to correctly sample and align the incoming data.

BRIEF DESCRIPTION OF THE DRAWINGS

The accompanying drawings, which are included as part of the present specification, illustrate the presently preferred embodiment of the present invention and together with the general description given above and the detailed description of the preferred embodiment given below serve to explain and teach the principles of the present invention.

DETAILED DESCRIPTION

A method and system for improved phase tracking is disclosed. In one embodiment, a method comprises identifying a slow-time varying phase drift on a link by counting long term beats; calibrating an interpolator with the phase drift; predicting a future phase drift; and updating the interpolator periodically with the future phase drift prediction.

In the following description, for purposes of explanation, specific nomenclature is set forth to provide a thorough understanding of the present invention. However, it will be apparent to one skilled in the art that these specific details are not required in order to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below.

Figure 1:
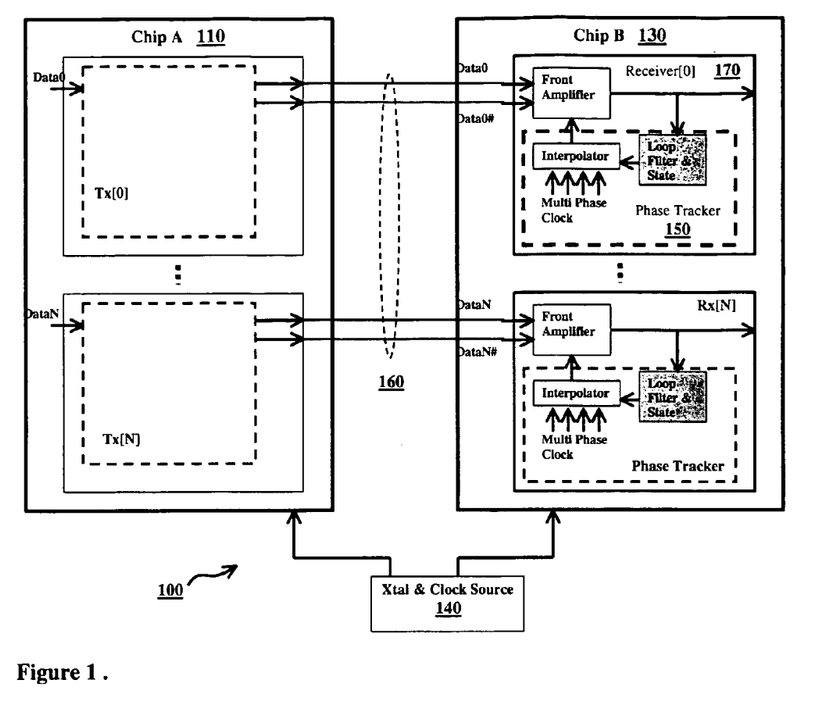
FIG. 1 illustrates a mesochronous multi-chip system, in which elements of the present invention may be implemented.

FIG. 1 illustrates a mesochronous multi-chip system 100 in which elements of the present invention may be implemented. System 100 includes a single crystal or clock source 140. Crystal 140 provides a clock signal to both Chip A 110 and Chip B 130. Chip A 110 and Chip B 130 may be part of the same chip set, such as I/O (Disk) channels found on a PC motherboard. However, the present method and system may be implemented within most circuits involving two or more chips experiencing non-time varying or slow varying (dφ/dt) phase drifts.

In one embodiment, a receiver 170 is included in system 100. To deal with the phase drift, phase tracker 150 is included in receiver 170. Receiver 170 may also be included within Chip B 130. Phase tracker 150 implements a method and system for improved phase tracking using fine interpolation.

Chip A 110 and Chip B 130 send data back and forth to each other. However, due to variations in chips, caused by temperature changes or voltage changes over time, phase differences occur between Chip A 110 and Chip B 130 in mesochronous system 100. Link 160 is one embodiment of a link with which phase tracker 150 may be configured, however most links between two chips are contemplated to be within the scope of the present system and method.

Figure 2:
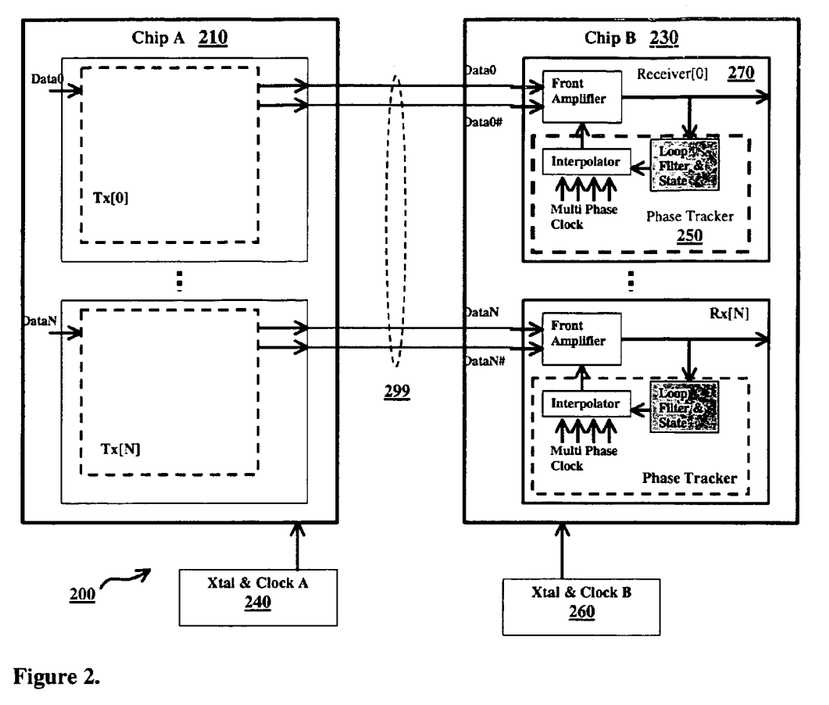
FIG. 2 illustrates a plesiochronous multi-clock system, in which elements of the present invention may be implemented.

FIG. 2 illustrates a plesiochronous multi-clock system 200, in which elements of the present invention may be implemented. Plesiochronous system 200 includes two crystal or clock sources, such as crystal 240 and crystal 260. Crystal 240 provides a timing signal to Chip A 210 and crystal 260 provides a timing signal to Chip B 230. Chip A 220 and Chip B 230 may be part of the same chipset. As with system 100, the present method and system may be implemented within most circuits where two chips experience non-time varying or slow-varying (dφ/dt) phase drifts.

In one embodiment, a receiver 270 is included in system 200. Phase tracker 250 is included in receiver 270 for dealing with phase drifts by implementing a method and system for improved phase tracking using fine interpolation. Chip B 230 and crystal 260 may also be included in receiver 270. In addition to temperature and voltage variations between Chip A 210 and Chip B 230, variations in the size and shape of crystal 240 and crystal 260 may cause phase drifts (dφ/dt). Link 299 connects Chip A 210 and Chip B 230.

Figure 3:
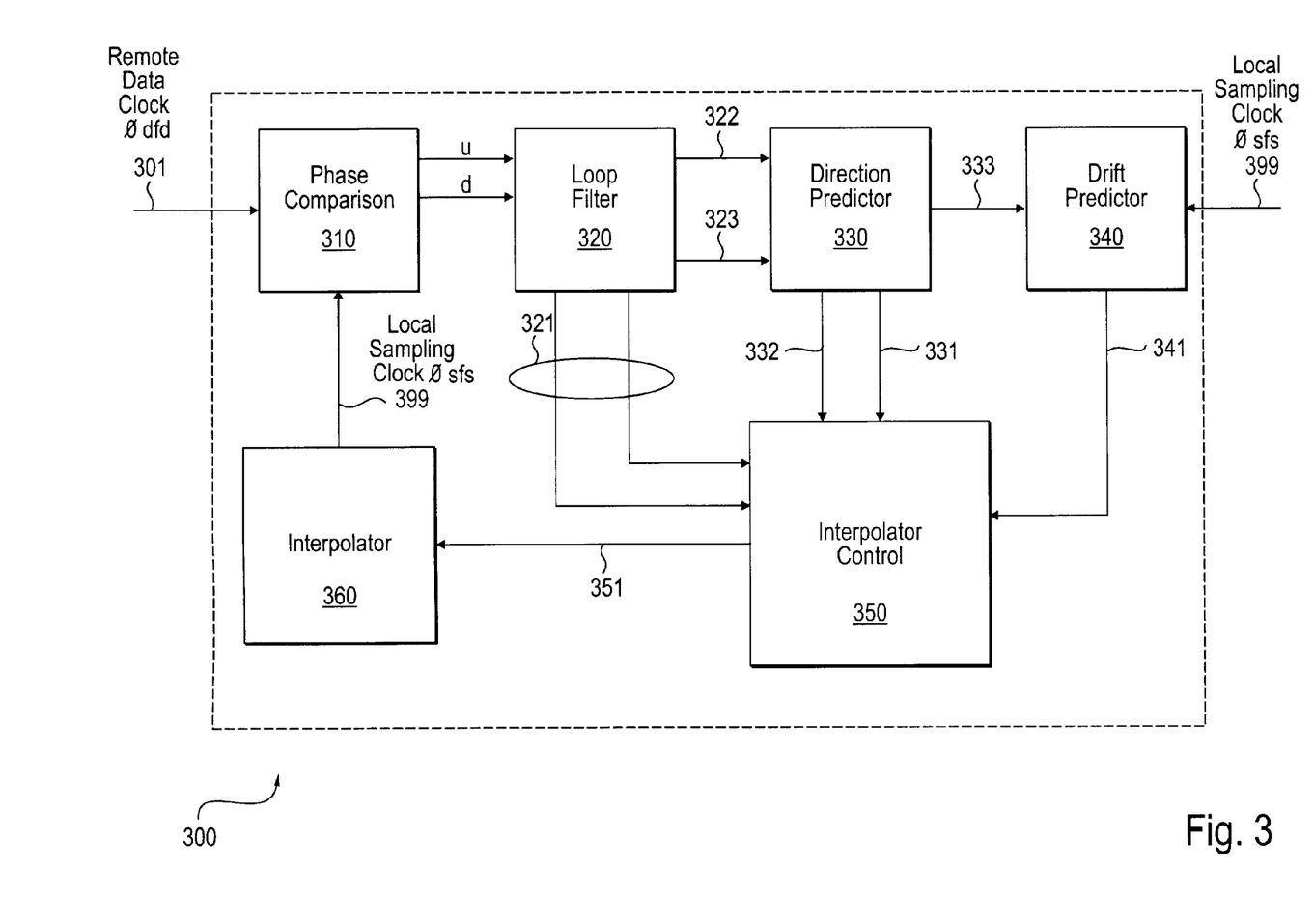
FIG. 3 illustrates a block diagram of a phase tracker according to one embodiment of the present invention.

FIG. 3 illustrates a block diagram of a phase tracker 300, such as phase tracker 250 or phase tracker 150. Phase tracker 300 has remote data clock $\phi_d f_d$ 301 and local sampling clock $\phi_s f_s$ 399 as inputs. Additional inputs to the interpolator 360 for data are not shown. Remote data clock signal $\phi_d f_d$ 301 may be provided by a crystal such as crystal A 240. Local sampling clock $\phi_s f_s$ 399 may be provided by a crystal such as crystal B 260.

Remote data clock $\phi_d f_d$ 301 is provided to phase comparison 310, as well as local sampling clock $\phi_d f_d$ 399. Phase comparison 310 generates two signals, u and d. u is provided when φd>φs. The signal d is provided when φs>φd. Each instance of u and d are provided to loop filter 320. Loop filter 320 maintains accumulators which determine when the total number of votes of u minus the total number of votes of d is greater than some predetermined threshold, $V_R$, to generate signal $u_f$ 322. Loop filter 320 also maintains accumulators which determine if the total number of votes of d minus the total number of votes of u is greater than the predetermined threshold, $V_R$, to generate signal $d_f$ 323. The threshold, $V_R$, is selected so as to minimize both $u_f$ 322 and $d_f$ 323 jitter, and provide accurate results are provided to interpolator control 350 via link 321 and to direction predictor 330. Loop filter 320 provides an indication to interpolator 360 for tracking the center of the eye, whether it is to move the interpolator's tracker up or down, so that sampling occurs accurately.

Direction predictor 330 stores the recommendation provided by loop filter 320. Direction predictor 330 provides a freeze signal 333 to drift predictor 340. Based on the local sampling clock $\phi_s f_s$ 399 and freeze signal 333, a drift compensation signal 341 is provided to interpolator control 350.

Interpolator control 350 accepts as inputs drift compensation signal 341, up control ($u_f$) and down control ($\phi_f$) 321 from loop filter 320, up predicted control 331, and down predicted control 332. Interpolator control 350 generates interpolator control signal 351 which instructs the interpolator 360 to either increase or decrease its phase. The interpolator 360 adjusts the interpolator's phase tracking to generate local sampling clock $\phi_s f_s$ 399. Individual blocks of FIG. 3 are described in greater detail and specificity below.

Figure 4:
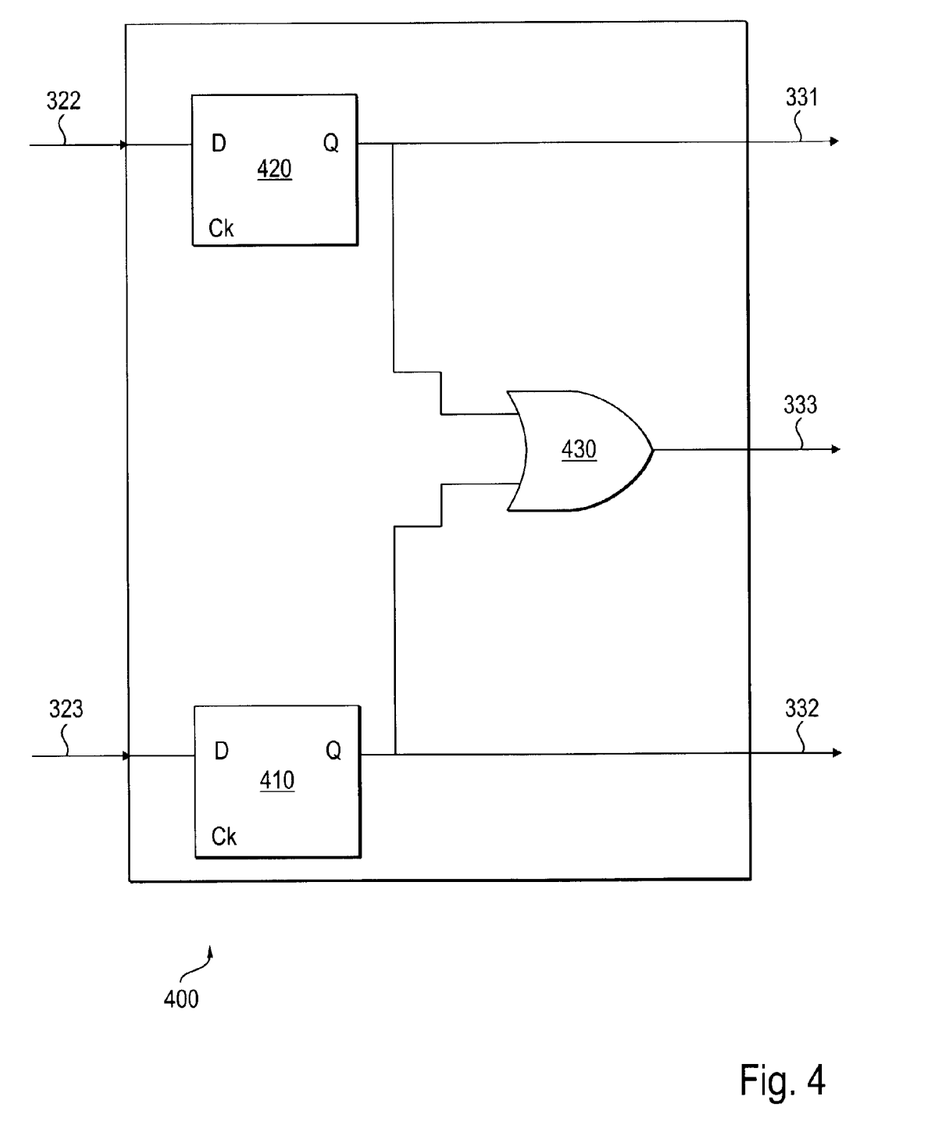
FIG. 4 illustrates a block diagram of a direction predictor, according to one embodiment of the present invention.

FIG. 4 illustrates a block diagram of a direction predictor 400, according to one embodiment. Direction predictor 400 may be used as direction predictor 330 in FIG. 3. There are two D-flip flops 410 and 420 included in direction predictor 400, as well as "OR" gate 410. The inputs of the "OR" gate 410 is the output of the flip-flops 410 and 420. "OR" gate 430 outputs the freeze signal 333. $u_f$ 322 is provided to flip-flop 420 and $d_f$ is provided to flip-flop 410. The output of flip-flops 410 and 420 are provided to interpolator control 350.

Figure 5:
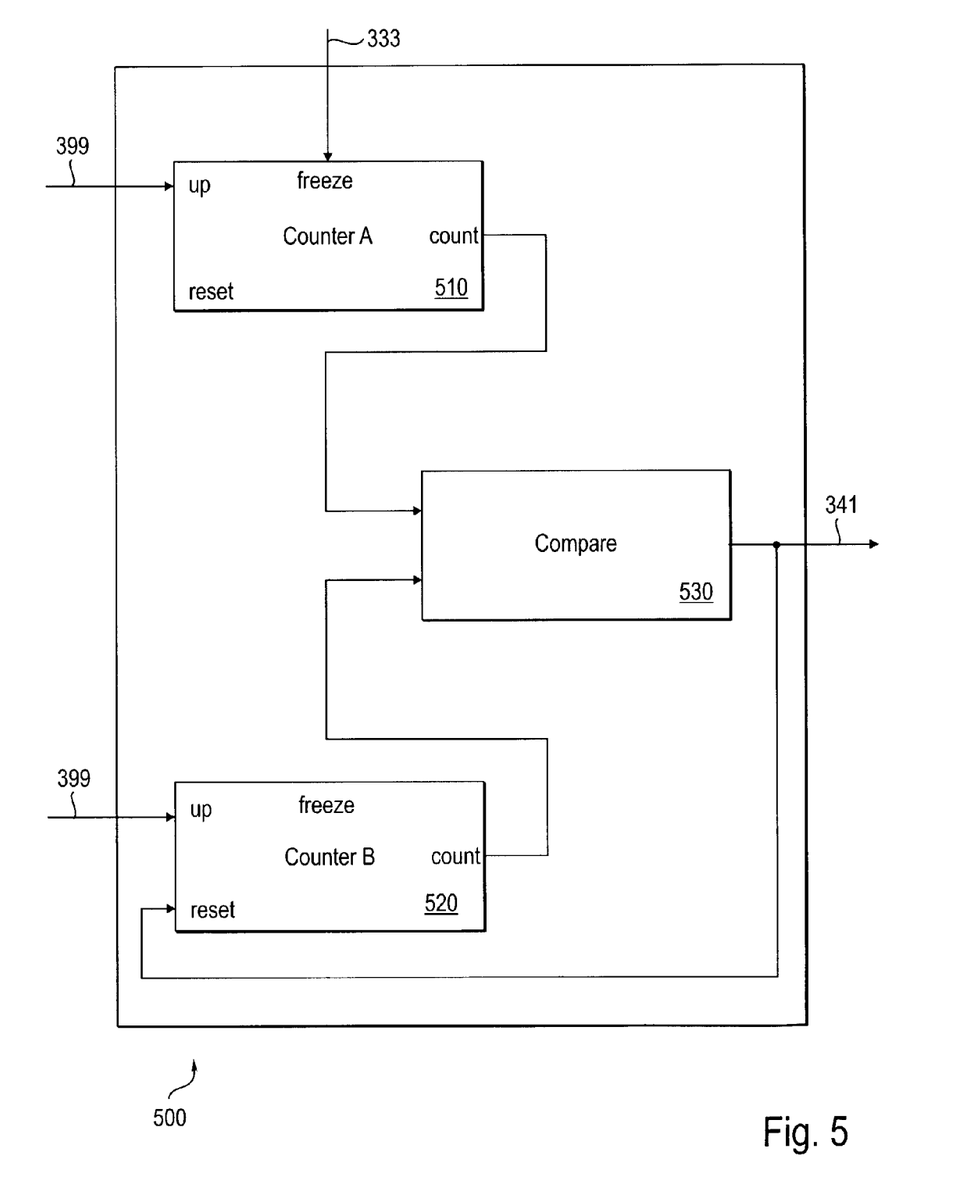
FIG. 5 illustrates a block diagram of a drift predictor, according to one embodiment of the present invention.

FIG. 5 illustrates a block diagram of a drift predictor 500, according to one embodiment. Drift predictor 500 may be used as drift predictor 340 in FIG. 3. There are two counters, counter A 510 and counter B 520 included in drift predictor 500, as well as comparator 530. The inputs signals of comparator are the output of counter A 510 and output of counter B 520. A drift compensation signal 341 is generated by comparator 530. The drift compensation signal is provided to interpolator control 350 and to counter B's 520 reset input. Counter A 510 accepts freeze signal 333. Both counter A 510 and counter B 540 accept local sampling clock 299 as input.

The present method identifies non-time (or slowly) varying frequency (dφ/dt) phase drift, calibrates it on a per link basis, and then uses the calibration to predict the phase drift periodically and update interpolator 360. The present method identifies a maximum phase drift (dφ/dt) caused by each factor, including clock PPM tolerance, Driver Side Temperature, Driver Side Voltage, Receiver Side Temperature, Receiver Side Voltage, Driver Side Phase Locked Loop (PLL) Phase Error. Driver Side PLL Jitter, Receiver Side PLL and Receiver Side PLL Jitter.

The Interpolator 360 has a rate of change of its phase drift larger than the maximum rate of change of the link, such as link 160 or link 299. Thus, dφ/dt Interpolator≧dφ/dt link. For a +/−150 ppm crystal tolerance, a resultant rate of phase drift as $300 \times 10^{-6} \times 2.5 \times 10^9 = 750 \times 10^3$ Hz or 750 kHz is implied.

8b/10b is a scheme that takes raw 8 bit input data, and maps it into a 10 bit stream. The stream has favorable properties for links, such as a guaranteed minimum transition density and DC balance (i.e., on average the same amount of high and low transitions). These properties allow link features such as clock recovery, error detection and AC coupling. For an 8b/10b coding there is a minimum of 20% indications or 500×10⁶ indications/sec. in a 2.5 Gb/sec. link. If there are 64 legs per Hz (360°) and the loop filter is also 64, then the maximum clock drift that can be tracked is 500×10⁶/(64·16)=~122 kHz (assuming all the votes [u and d] indicate the correct direction of drift). This is smaller than the 750 kHz requirement calculated above. Thus, the loop filter is trimmed to less than 16 votes, then the maximum clock drift that may be tracked is 500×10⁶/(64·16)=~488 kHz. If the 16 votes (u and d) are too few to average out the noise, the interpolation legs (or resolution) is decreased. The finer the interpolation, the more precise sampling clock is place (centered on the data), therefore, improving testing ability (read yields) and link performance.

Figure 6:
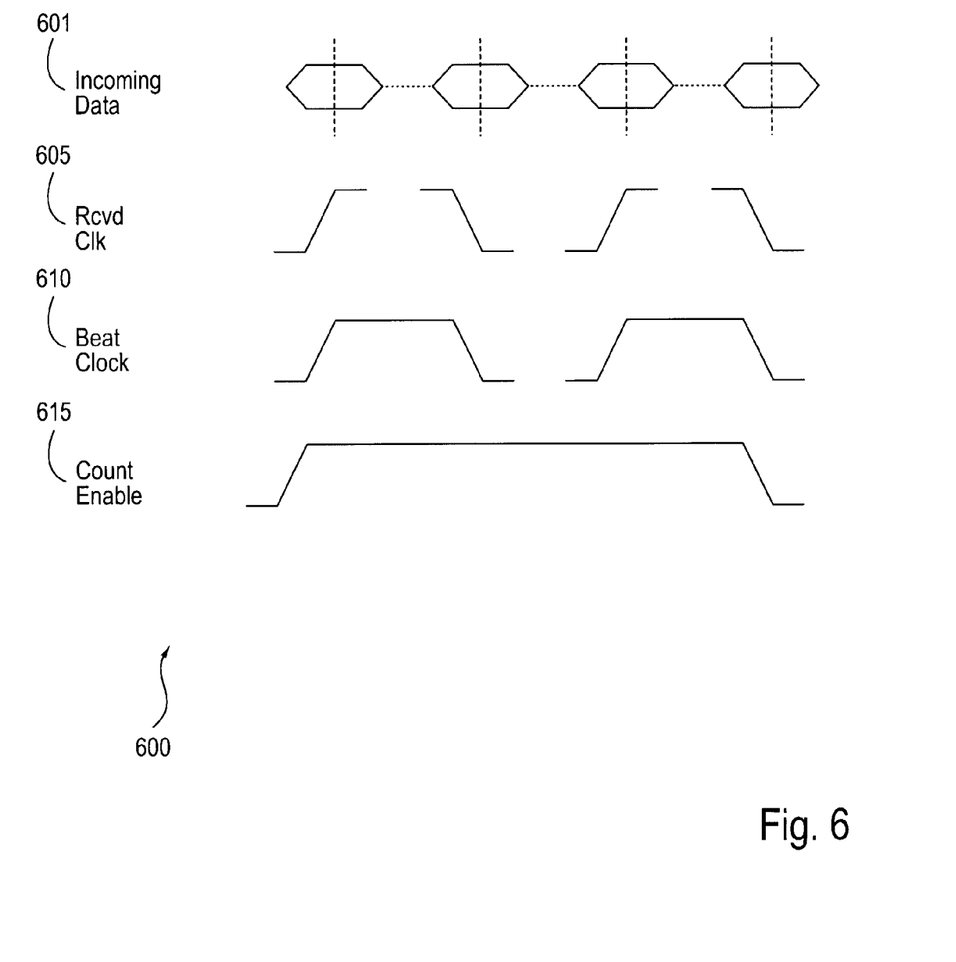
FIG. 6 illustrates various signals used for predicting phase changes in the phase comparator.

The present method matches the interpolator indications with the bandwidth of the loop filter 320 and weighs them against their effect on the interpolator's phase tracking. For example, a large portion of phase drift has the fastest rate of change of phase due to clock drifts, which does not have a time varying component. Since, the phase drift (dφ/dt) can be calibrated during initialization, that dφ/dt value can be used to predict the phase change at the receiver. The calibration and prediction may be performed by counting the beat frequency at start-up. FIG. 6 illustrates the various signals used for calibration and prediction of the phase drift dφ/dt. Shown in FIG. 6 are, incoming data signal 601, received clock signal 605, beat clock signal 610 and count enable signal 615. A beat count interval sufficiently large to average out higher frequency noise componnets. The prediction number is based on the beat count interval divided by the count (in Receiver Clock Cycles):

$$\text{Update\_Cycle} = \frac{Rcv - Clk - Cycles}{Beats \times N}$$

Figure 7:
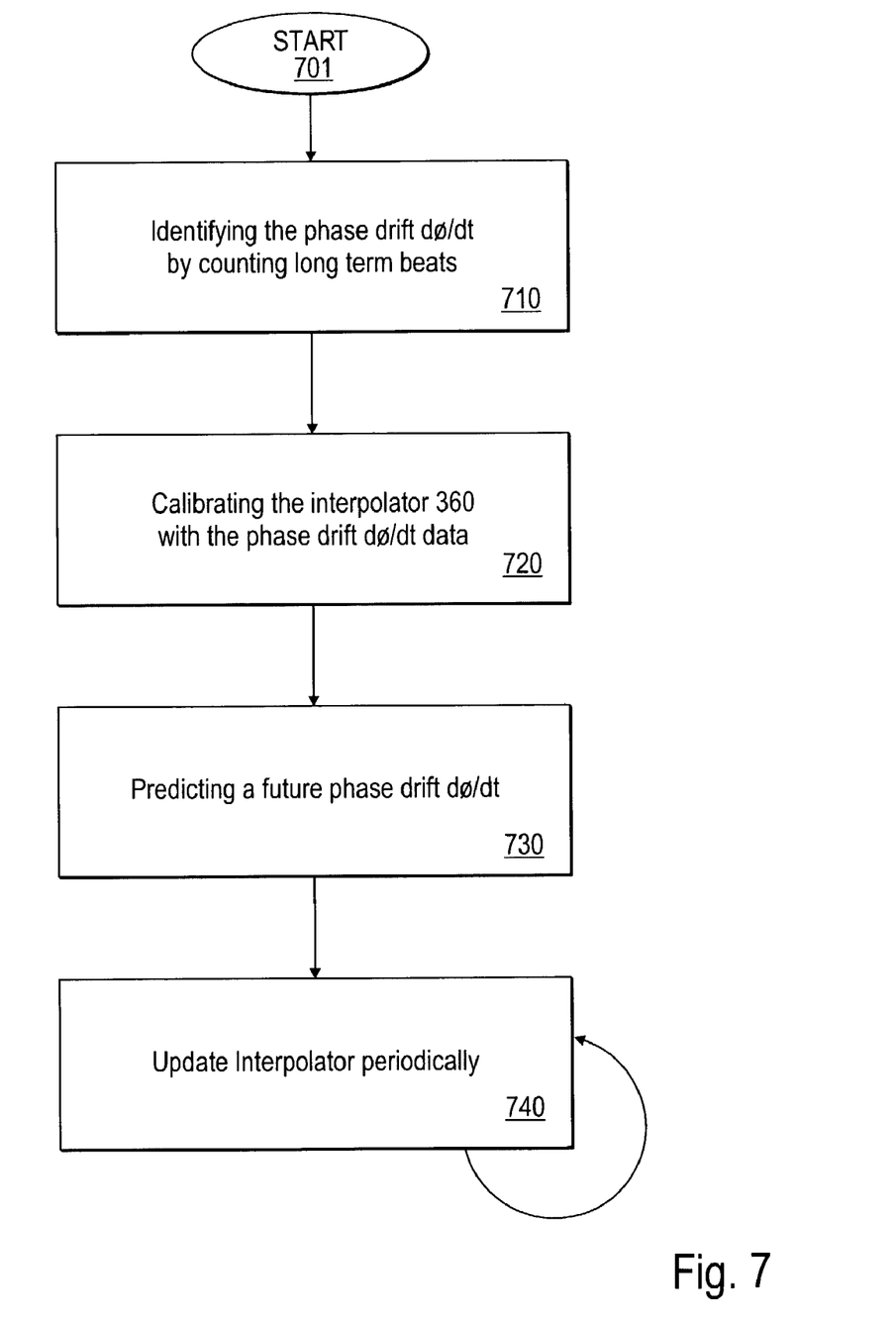
FIG. 7 illustrates a flow chart for improved phase tracking according to one embodiment of the present invention.

FIG. 7 illustrates a flow chart for improved phase tracking according to one embodiment of the present invention. The process 700 begins at block 701. Flow continues to processing block 710, where phase tracker 250 identifies the phase drift (dφ/dt) after normal initialization. The phase drift (dφ/dt) is determined by counting the long term beats as discussed above. Flow continues to processing block 720 where phase tracker 150 calibrates interpolator 360 with the phase drift dφ/dt data. At processing block 730, phase tracker 150 predicts a future phase drift dφ/dt. Flow continues to processing block 740 where interpolator 360 is updated periodically with the predicted phase drift value. Block 740 is repeated, indicating the periodic update.

A method and system for improved phase tracking using fine interpolation is disclosed. Although the present invention has been described with respect to specific examples and subsystems, it will be apparent to those of ordinary skill in the art that the invention is not limited to these specific examples or subsystems but extends to other embodiments as well. The present invention includes all of these other embodiments as specified in the claims that follow.

We claim:

1. A method, comprising:
    identifying a slow-time varying phase drift on a link by counting long term beats;
    calibrating an interpolator with the phase drift;
    predicting a future phase drift; and
    updating the interpolator periodically with the future phase drift prediction.

2. The method of claim 1, further comprising:
    initializing timing; and
    framing.

3. The method of claim 2, wherein predicting a future phase drift comprises:
    generating a vote that indicates if the interpolator should shift phase up or down;
    providing the vote to a loop filter that accumulates one or more additional votes, until a predetermined threshold is met;
    providing filter signals from the loop filter to a direction predictor that predicts which direction the interpolator should shift;
    providing a freeze signal to a drift predictor that predicts the drift compensation needed by the interpolator; and
    providing the filter signals, a drift compensation signal from the drift predictor, to an interpolator controller that generates a future phase drift prediction.

4. The method of claim 3, wherein the link connects two micro chips.

5. The method of claim 4, wherein the two micro chips are part of a plesiochronous system.

6. A computer-readable medium having stored thereon a plurality of instructions, said plurality of instructions when executed by a computer, cause said computer to perform:
    identifying a slow-time varying phase drift on a link by counting long term beats;
    calibrating an interpolator with the phase drift;
    predicting a future phase drift; and
    updating the interpolator periodically with the future phase drift prediction.

7. The computer-readable medium of claim 6, having stored thereon additional instructions, said additional instructions when executed by a computer, cause said computer to further perform:
    initializing timing; and
    framing.

8. The computer-readable medium of claim 7, having stored thereon additional instructions, said additional instructions when executed by a computer for predicting a future phase drift, cause said computer to further perform:
    generating a vote that indicates if the interpolator should shift phase up or down;
    providing the vote to a loop filter that accumulates one or more additional votes, until a predetermined threshold is met;
    providing filter signals from the loop filter to a direction predictor that predicts which direction the interpolator should shift;
    providing a freeze signal to a drift predictor that predicts the drift compensation needed by the interpolator; and
    providing the filter signals, a drift compensation signal from the drift predictor, to an interpolator controller that generates a future phase drift prediction.

9. The computer-readable medium of claim 8, wherein the link connects two micro chips.

10. The computer-readable medium of claim 9, wherein the two micro chips are part of a plesiochronous system.

* * * * *

UNITED STATES PATENT AND TRADEMARK OFFICE
CERTIFICATE OF CORRECTION

PATENT NO. : 7,126,986 B2 Page 1 of 1
APPLICATION NO. : 10/262359
DATED : October 24, 2006
INVENTOR(S) : Dabral et al.

It is certified that error appears in the above-identified patent and that said Letters Patent is hereby corrected as shown below:

In column 1, at line 31, after "available." delete "relatively simple transmission lines. Such transmission lines typically include only one or two conductors, in contrast with the 64-bit and wider data paths within computing systems now commonly available.".

Signed and Sealed this

Twenty-seventh Day of March, 2007

JON W. DUDAS
*Director of the United States Patent and Trademark Office*